United States Patent
Yoshizawa et al.

(10) Patent No.: US 7,372,330 B2
(45) Date of Patent: May 13, 2008

(54) VARIABLE GAIN AMPLIFIER

(75) Inventors: Hiroyasu Yoshizawa, Ome (JP); Satoshi Hanazawa, Hamura (JP)

(73) Assignee: Hitachi, Ltd., Tokyo (JP)

( * ) Notice: Subject to any disclaimer, the term of this patent is extended or adjusted under 35 U.S.C. 154(b) by 125 days.

(21) Appl. No.: 11/484,591

(22) Filed: Jul. 12, 2006

(65) Prior Publication Data

US 2007/0075774 A1 Apr. 5, 2007

(30) Foreign Application Priority Data

Sep. 30, 2005 (JP) ............... 2005-285876

(51) Int. Cl.
*H03F 3/45* (2006.01)
(52) U.S. Cl. ..................... 330/254; 330/253
(58) Field of Classification Search ............... 330/253, 330/254, 295; 327/346, 359, 563
See application file for complete search history.

(56) References Cited

U.S. PATENT DOCUMENTS

| | | | |
|---|---|---|---|
| 5,418,494 A * | 5/1995 | Betti et al. .................. 330/254 |
| 6,084,466 A * | 7/2000 | Phanse et al. .............. 330/254 |
| 6,175,278 B1 | 1/2001 | Hasegawa |
| 7,279,984 B2 * | 10/2007 | Grillo et al. ................ 330/253 |

FOREIGN PATENT DOCUMENTS

| JP | 11-177357 A | 7/1999 |
|---|---|---|
| JP | 11-340760 A | 12/1999 |
| JP | 2004-104269 A | 4/2004 |

OTHER PUBLICATIONS

Analog Devices, Inc., Data Sheet AD8332, "Ultralow Noise VGAs with Preamplifier and Programmable $R_{IN}$", pp. 1-32, © 2003.
Texas Instruments, Inc., Data Sheet VCA2616, "Dual, Variable-Gain Amplifier with Low-Noise Preamp", pp. 1-19, © 2002-2004.

* cited by examiner

*Primary Examiner*—Khanh Van Nguyen
(74) *Attorney, Agent, or Firm*—Miles & Stockbridge P.C.

(57) ABSTRACT

A variable gain amplifier of such configuration that can yield continuously and log-linearly variable gains in relation to control voltage and, at the same time, that does not use an attenuator, an element which otherwise would entail cause of increased noise. The amplifier includes a plurality of gm amplifiers connected in parallel with input signal, exponential multipliers connected respectively to the gm amplifiers, a control section to vary the multiplication coefficient of the exponential multipliers according to the external gain control signal, and an I-V converter circuit to aggregate current output after multiplication and convert the aggregated current output to voltage. A continuously variable gain characteristic can be obtained without the use of an attenuator but by varying multiplication coefficient according to control voltage.

7 Claims, 9 Drawing Sheets

FIG. 5A (a) WITHOUT R32-1∼R32-n RESISTANCE WEIGHTING

FIG. 5B (b) WITH R32-1∼R32-n RESISTANCE WEIGHTING

VARIABLE GAIN AMPLIFIER

CLAIM OF PRIORITY

The present application claims priority from Japanese application JP 2005-285876 filed on Sep. 30, 2005, the content of which is hereby incorporated by reference into this application.

FIELD OF THE INVENTION

This invention relates to a variable gain amplifier and, in particular, to a variable gain amplifier most suitably used for variable gain control of a preamplifier for an ultrasonic diagnostic system.

BACKGROUND OF THE INVENTION

Figure 8:
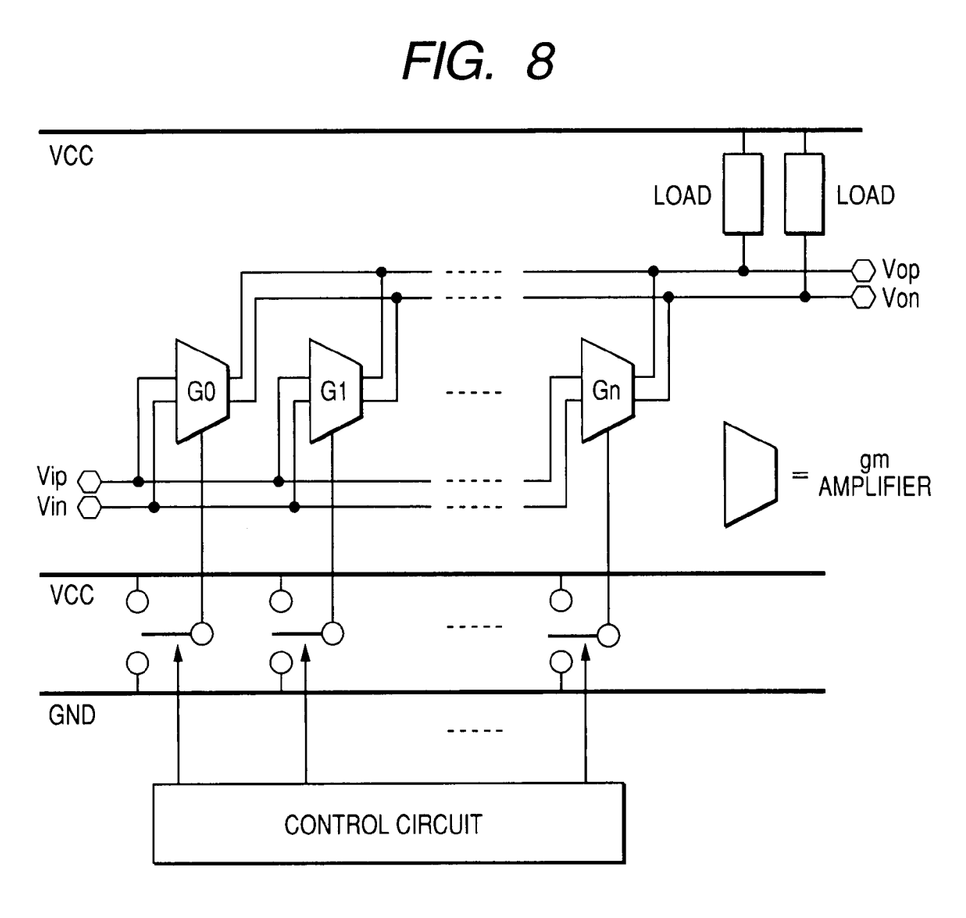
FIG. 8 is a block diagram showing an example of a related configuration of a variable gain amplifier.

JP 1999-177357 A contains a description concerning a variable gain amplifier using MOS. As shown in FIG. 8 (FIG. 1 in the patent document), it is an example of a variable gain amplifier which can realize a predetermined gain by combining an on-and-off of mutual conductance provided individually with a programmable control.

Figure 9:
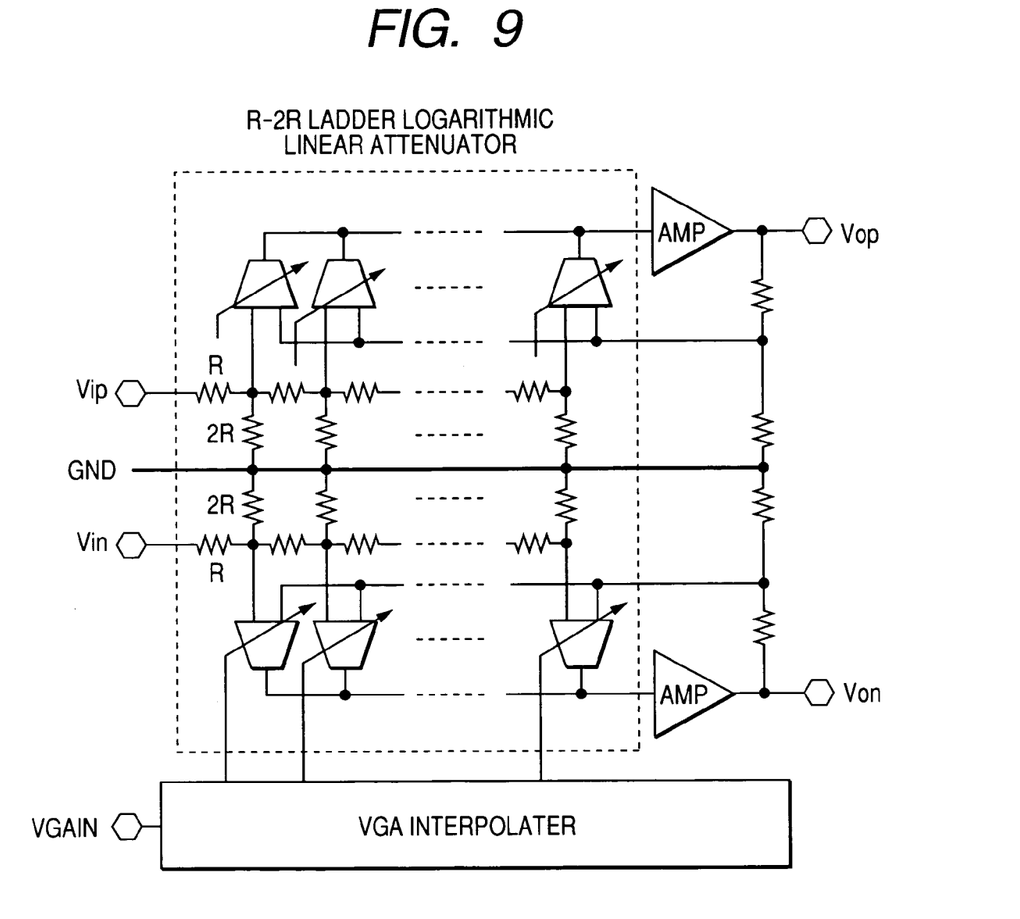
FIG. 9 is a block diagram showing another example of a related configuration of a variable gain amplifier.

The Data Sheet AD8332 of Analog Devices, Inc. describes a variable gain amplifier suitable for an ultrasonic diagnostic system. Particularly, as shown in FIG. 9 (FIG. 60 in the document), it is an example of a variable gain amplifier configured with attenuators, in which R-2R ladders and interpolation tap controls are combined together, as well as the subsequent-stage amplifiers, so that it may be provided with logarithmic linear amplifying characteristic in relation to control voltage.

Figure 10:
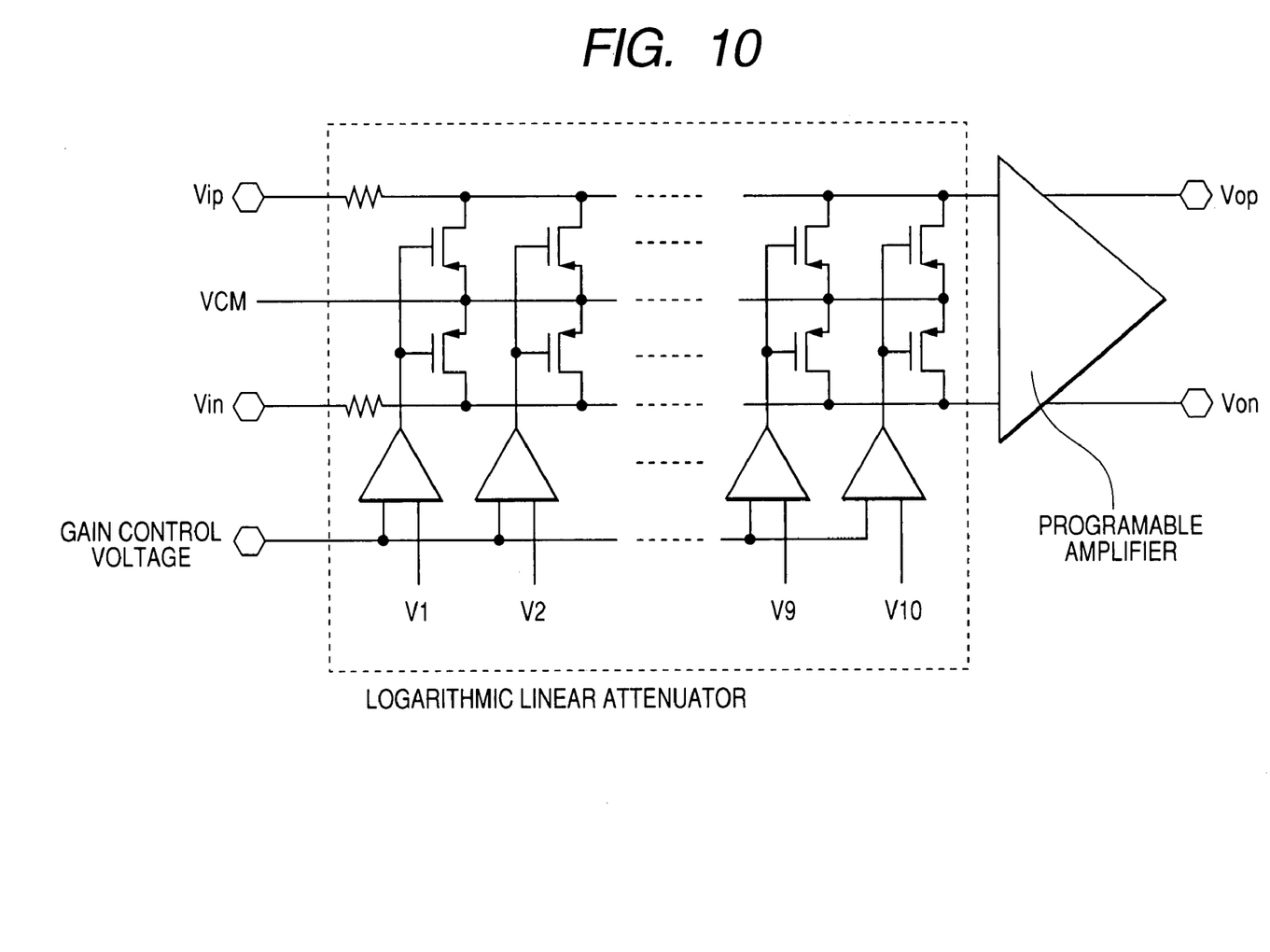
FIG. 10 is a block diagram showing a further example of a related configuration of a variable gain amplifier.

The Data Sheet VCA2616 of Texas Instruments Incorporated has a description concerning a variable gain amplifier suitable for an ultrasonic diagnostic system. In particular, as shown in FIG. 10 (FIG. 12 in the document), it is an example of a variable gain amplifier configured with attenuators, in which resisters and MOSFETs connected in parallel take various on-and-off combinations so as to produce varied voltage division ratio, as well as a subsequent-stage programmable amplifier, so that it may be provided with logarithmic linear amplifying characteristic in relation to control voltage.

SUMMARY OF THE INVENTION

An ultrasonic diagnostic system is a system to project an ultrasonic wave to a measuring object and observe the behaviors of the reflected wave. Since the signal power of a reflected wave generally decays exponentially (or linearly if shown by logarithmic scale) corresponding to the reflecting point (depth from the surface of the object), the signal power of the reflected wave received on the receiving end also decays exponentially as time passes. A variable gain amplifier used in an ultrasonic diagnostic system is intended to vary the amplifier gain continuously with time or corresponding to the reflecting point for the purpose of amplifying the input signal power or the receiving signal to a desired level irrespective of the reflecting point. For this purpose, it may be important that a variable gain amplifier have such characteristics as low noise, continuous and log-linear amplifying gain in response to control voltage, and so forth.

Prior to the present application, the inventors hereof made studies about a variable gain amplifier. The circuit disclosed in JP 1999-177357 A which is to realize the function of variable gain amplification by means of combination of a plurality of individually predetermined mutual conductance amplifiers is shown in FIG. 8. In this circuit, however, the combination of mutual conductance amplifiers in relation to control voltage, that is, the setting of variable gain amplifiers, is rather too discrete without proper consideration paid for the continuity of variable gain in relation to control voltage. On the other hand, increasing the number of taps of the amplifier to a level where the discrete intervals could be ignored is not realistic in view of the size of the circuit.

An amplifier that enables continuous and log-linear variation of the variable gain amplifying function in relation to control voltage is realizable in the configuration in which attenuators and subsequent-stage amplifiers are combined in such a way as the circuits introduced in the Data Sheet AD8332 of Analog Devices, Inc. and the Data Sheet VCA2616 of Texas Instruments Incorporated. The same circuits are shown in FIGS. 9 and 10. In these circuits, however, it is not taken into consideration that the configuration of attenuators and subsequent-stage amplifiers combined together entails increased noise on account of the load of the attenuators being inserted in series with the input of the amplifier.

An object of the present invention is to provide a variable gain amplifier that can yield continuously and log-linearly variable gains in relation to control voltage and that does not use an attenuator, a circuit element which otherwise would entail increased noise.

A preferred embodiment of the present invention is presented as follows. That is, such embodiment of the present application configures a variable gain amplifier comprising a plurality of gm amplifiers connected in parallel with input signal, exponential multipliers connected respectively to the foregoing gm amplifiers, a control section to change the multiplication coefficient of the exponential multipliers according to the external gain control signal, and an I-V converter circuit to aggregate current output after multiplication and convert the aggregated current output to voltage.

A representative effect of the present invention by the above means is to be able to provide a variable gain amplifier with its gain varying continuously at a low noise level.

DETAILED DESCRIPTION OF THE PREFERRED EMBODIMENT

Hereunder, a preferred embodiment of the present invention is explained in detail with reference to the accompanying drawings. Circuit elements to constitute each block of the embodiment are not subject to any particular limitation but are commonly formed on one piece of semiconductor substrate such as single crystal silicone by utilization of well-known bipolar transistor, CMOS (complementary metal-oxide semiconductor transistor), and other integrated circuit technology.

FIRST EMBODIMENT

Figure 1:
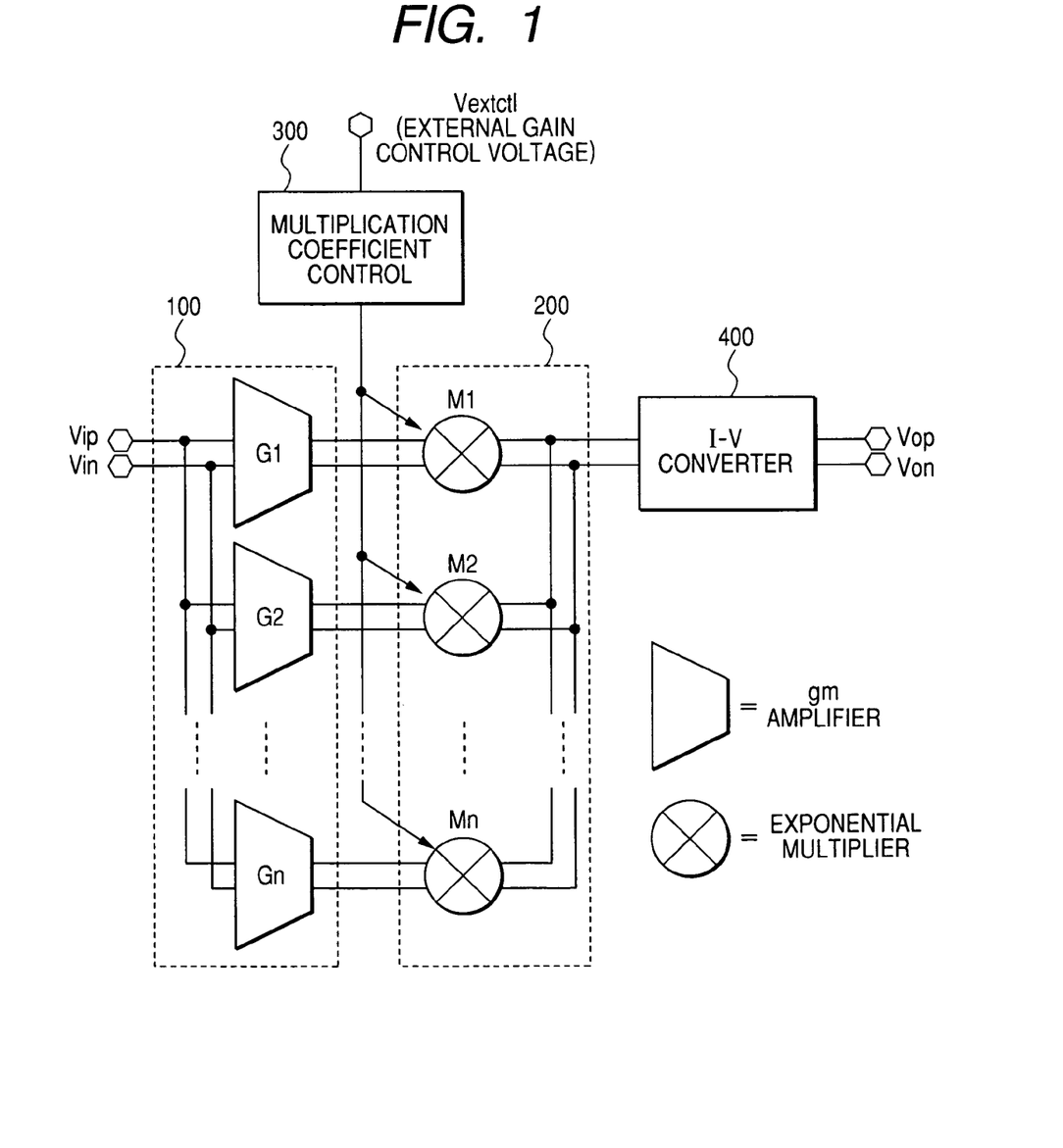
FIG. 1 is a block diagram of a variable gain amplifier according to an embodiment of the present invention.

FIG. 1 represents a first embodiment of the variable gain amplifier according to the present invention. This variable gain amplifier includes the gm amplifier section 100 having a plurality of gm amplifiers G1 to Gn connected in parallel with the differential inputs Vip and Vin, the multiplier section 200 having the exponential multipliers M1 to Mn to conduct exponential multiplication according to respective output currents from the gm amplifiers G1 to Gn, the multiplication coefficient control section 300 to control the multiplication coefficient for the respective exponential multipliers M1 to Mn in accordance with the external gain control voltage Vextctl, and the I-V converter section 400 to aggregate the output currents from the respective exponential multipliers M1 to Mn for conversion to differential voltage outputs Vop and Von. In the above operation, the conductances of the gm amplifiers M1 to Mn are set so that the current amplification ratios can take the values of 1, 2, $2^2$, ..., and $2^{n-1}$.

Figure 2A:
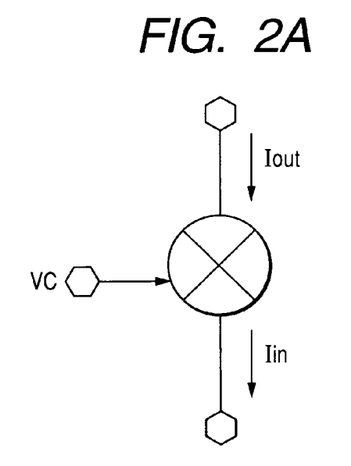
FIG. 2A is a drawing showing the correspondence of input and output signals in the exponential multiplier circuit included in FIG. 1.
Figure 2B:
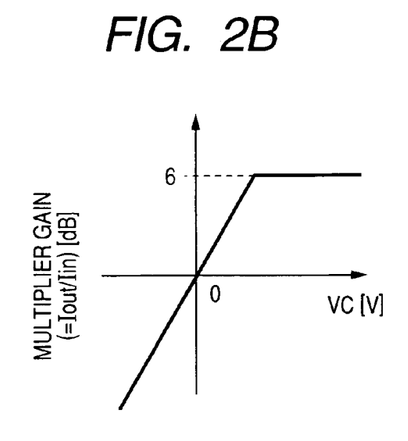
FIG. 2B is a drawing showing the multiplication characteristic of the exponential multiplier circuit included in FIG. 1.
Figure 3:
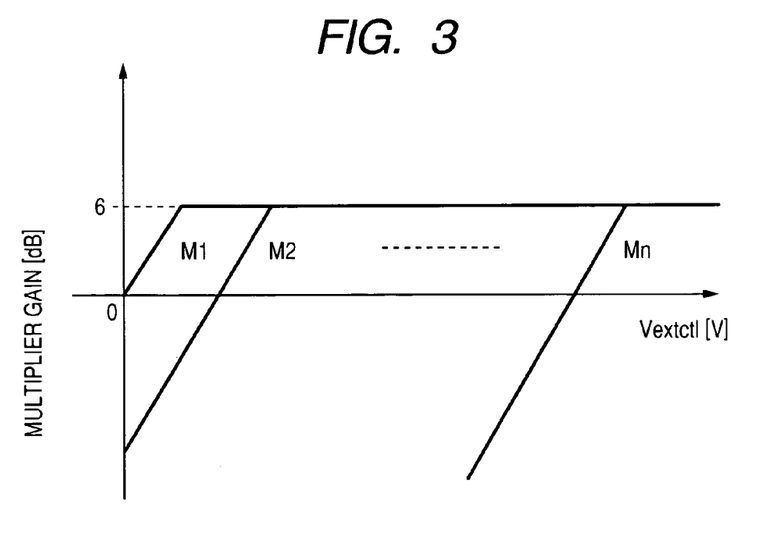
FIG. 3 is a drawing showing the correspondence between the multiplication characteristic preset for n units of the exponential multipliers and the gain control voltage.

When the gm amplifier is made up to be of on-and-off type as was the related technique, the gains can move over only discretely. Instead of on-and-off operation, therefore, the present invention utilizes filtering of current by means of an exponential multiplier to carry out an equivalent of the on-and-off function. FIG. 2A shows the correspondence of input and output signals in the exponential multiplier, and FIG. 2B shows the multiplication coefficient response of the exponential multipliers according to the control voltage. When the multiplication characteristic shown in FIG. 2B is applied to input current, it will result in the following characteristic: if multiplier control voltage>>0, output current=2 times; if multiplier control voltage 0, output current=1 time; if multiplier control voltage<<0, output current gain≈0 times. If the multiplication coefficient shown in FIG. 2B is given to each of the exponential multipliers M1 to Mn, at different timings, it is possible to realize continuously variable gains. FIG. 3 shows the relationship between the multiplication coefficients assigned to each of the exponential multipliers M1 to Mn and the control voltages. By providing the setting shown in FIG. 3, it becomes possible for the gains of the summational output currents after passing through the respective exponential multipliers to realize continuous and linear response in relation to the control voltage. In addition, the above configuration of the first embodiment does not require any attenuator which otherwise would be apt to become an additional cause of noise, promising much improved low-noise characteristic.

Figure 4:
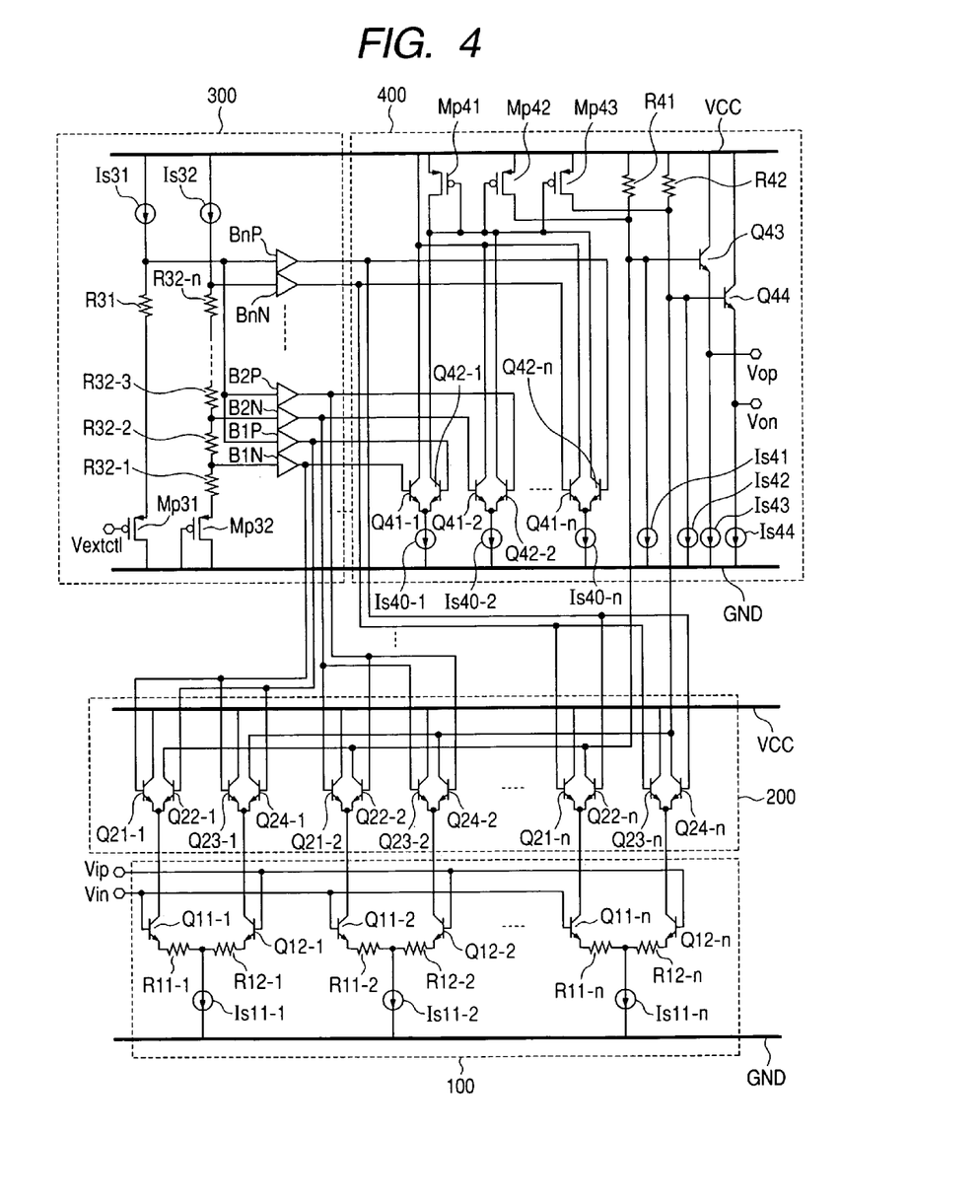
FIG. 4 is a detailed circuit diagram showing the variable gain amplifier according to an embodiment of the present invention.

An example of concrete configuration based on FIG. 1 is shown in FIG. 4. The designation numbers of 100, 200, 300, and 400 used in FIG. 4 respectively refer to the blocks having the same numbers in FIG. 1. The gm amplifiers section 100 has n units of gm amplifiers, each comprising bipolar transistors (Q11-1 to Q-11-*n* and Q12-1 to Q12-*n*), resistors (R11-1 to R11-*n* and R12-1 to R12-*n*), and current sources (Is11-1 to Is11-*n*), with the resistance value of each unit being adjusted and set so that the amplification ratio of respective conductance can take the values of 1, 2, $2^2$, ..., and $2^{n-1}$. The multiplication section 200 is composed of n units of multipliers comprising two pairs of emitter-coupled bipolar pair transistors (Q21-1 to Q21-*n*, Q22-1 to Q22-*n*, Q23-1 to Q23-*n*, and Q24-1 to Q24-*n*) The gain control section 300 includes current sources (Is31 and Is32), PMOS transistors (Mp31 and Mp32), resistors (R31 and R32-1 to R32-*n*), and buffers (B1P to BnP and B1N to BnN) and creates control signals for the exponential multipliers by utilizing the signal generated on the basis of the external gain control voltage Vextctl and the internal reference electrical potentials generated by making use of the potential effect of resistors and having uniformly spaced difference in potential. The I-V converter circuit section 400 includes current sources (Is40-1 to IS40-*n* and Is41 to Is44), resistors (R41 and R42), bipolar transistors (Q41-1 to Q41-*n*, Q42-1 to Q42-*n*, Q43, and Q44), and PMOS transistors (Mp41, Mp42, and Mp43). The output current after passing through each exponential multiplier is converted into voltage by means of the load resistance (R41 and R42). In the aforementioned process, the DC output current after passing through the exponential multiplier is also varied according to the external gain control voltage. To prevent fluctuation of the output DC level in such circumstances, the amount of current equal to the amount of fluctuation of the DC output current is additionally supplied from the current source of the PMOS transistors (Mp42 and Mp43).

As is recognized from FIG. 4, the consumption current of the circuit shown in FIG. 4 is constant regardless of the gain setting. Therefore, even if there is a change in gain, little fluctuation attributable to variation in consumption current is caused to the power supply VCC; thus, suppressive effect is expectable on the noise which, otherwise, might derive from fluctuation of the power supply VCC.

Figure 5A:
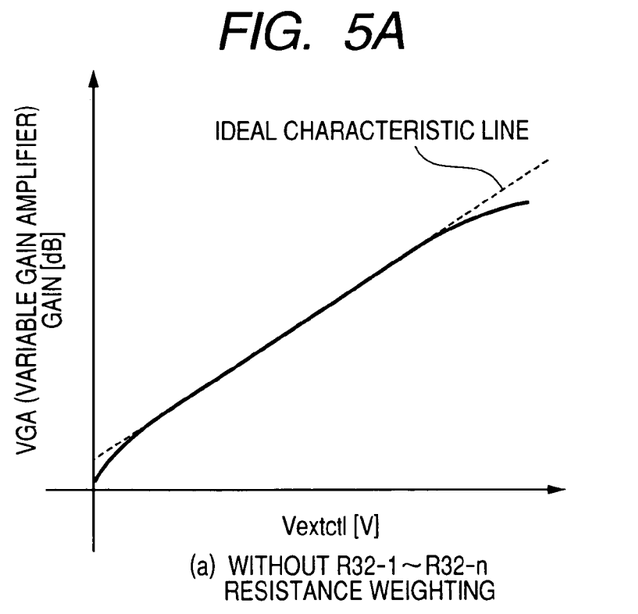
FIG. 5A is a graphical representation concerning the response characteristic between the amplification gains after logarithmic conversion and the external control voltage in regard to the circuit in FIG. 4.
Figure 5B:
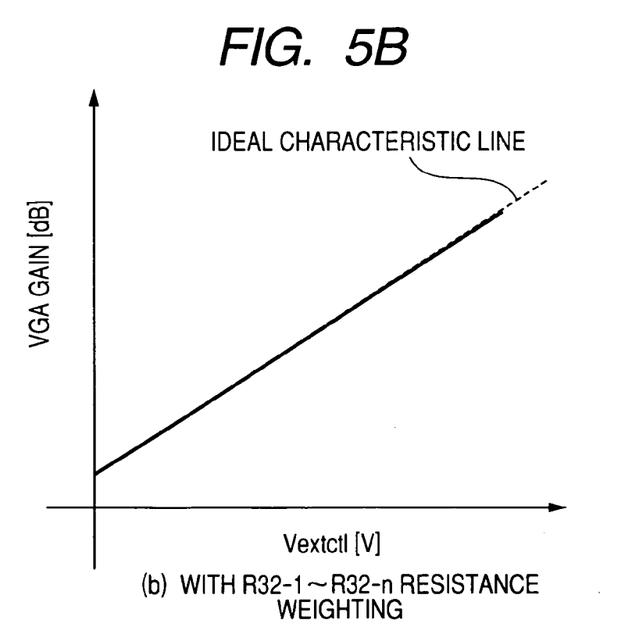
FIG. 5B is a graphical representation concerning the response characteristic between the amplification gains after logarithmic conversion and the external control voltage in regard to the circuit in FIG. 4.

When the resistors R32-1 to R32-*n* in the gain control section 300 in FIG. 4 showing the first embodiment of the present invention are set all to have the same resistance value, the logarithm-converted response characteristic line between the amplification gain and the external gain control voltage will have non-linear regions on both ends of the control voltage span as shown in FIG. 5A. These non-linear regions of the characteristic line can be reformed into a linear response line as shown in FIG. 5B by giving weighting of resistance value to the resistors R32-1 to R32-*n*.

Figure 6:
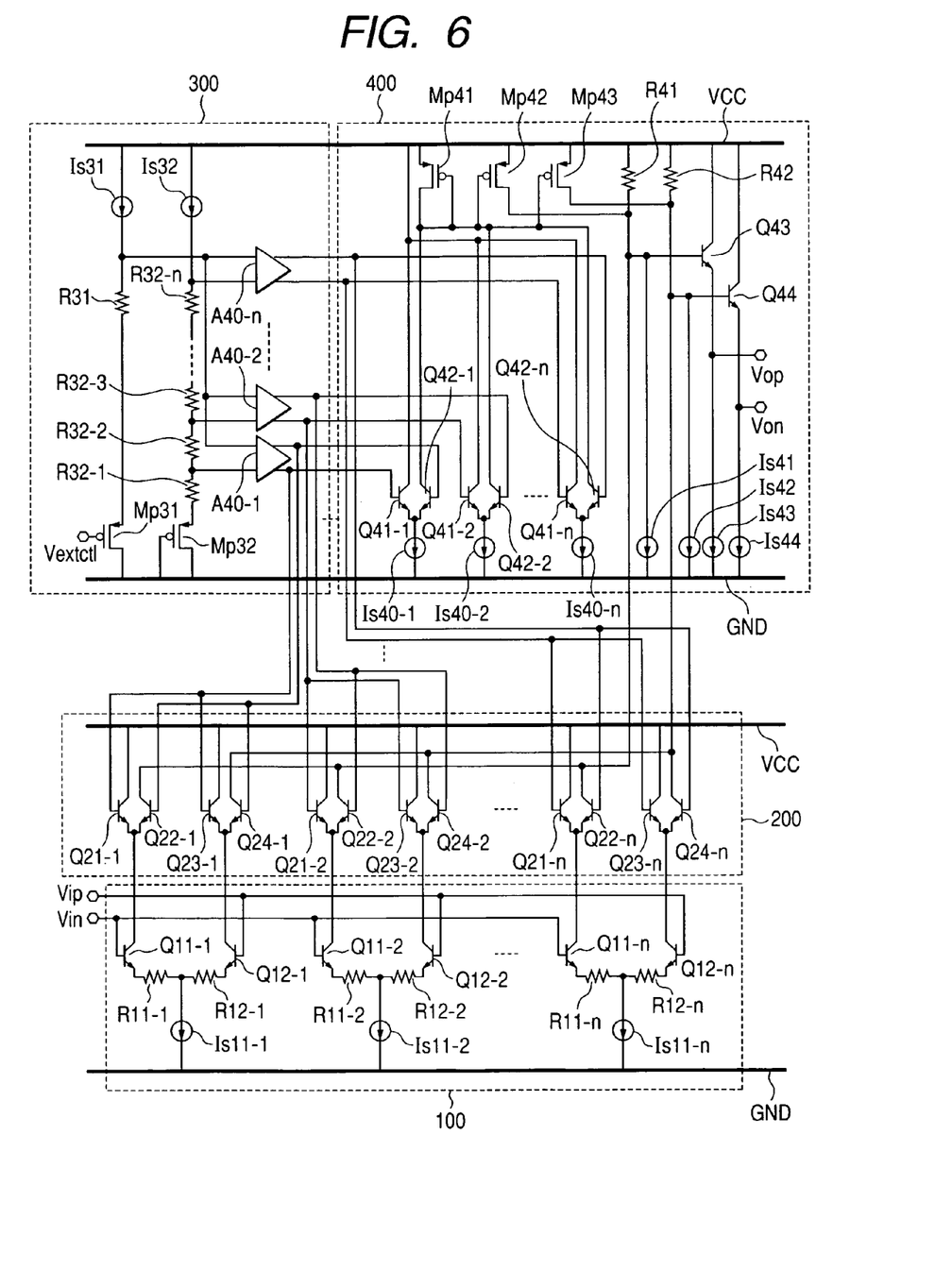
FIG. 6 is the same embodiment of the present invention as FIG. 4 except that the buffer of the gain control section has been replaced with a differential amplifier.

In reference to the first embodiment, the buffers (B1P to BnP and B1N to BnN) in the gain control section 300 shown in FIG. 4 can be replaced with low-gain differential amplifiers (A40-1 to A40-*n*) as illustrated in FIG. 6. Such replacement makes the control voltage of each exponential multiplier even in DC level and thus earns the effect of liberalizing the DC design for the whole circuit from limitations. Furthermore, it also becomes possible to reduce the effect of coupling that otherwise might occur by way of parasitic capacitance between the control voltage of each exponential multiplier and the resistors (R32-1 to R32-n and R31) in the gain control section 300.

Figure 7:
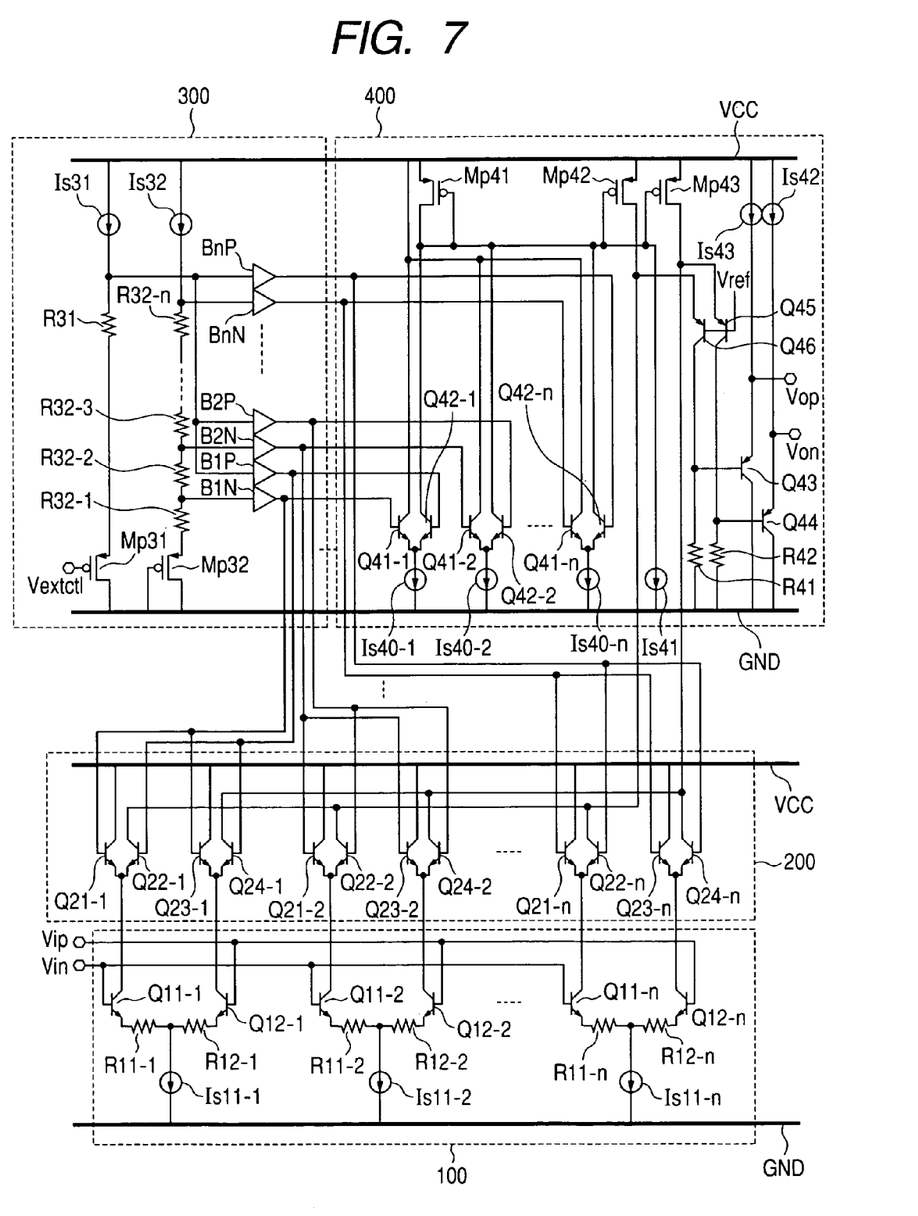
FIG. 7 is the same embodiment of the present invention as FIG. 4 except that improvement has been made of the output dynamic range of the I-V converter circuit.

In the first embodiment, the I-V converter circuit section 400 in FIG. 4 can be replaced with the I-V converter circuit section 400 shown in FIG. 7. When such replacement is done, the operational region for I-V conversion is shifted from between the power supply VCC and the exponential multiplier output to between the exponential multiplier output and GND, and this produces such good effects as expanded output dynamic range and reduced power supply voltage.

What is claimed is:

1. A variable gain amplifier comprising:
   a plurality of gm amplifiers connected in parallel with input signal;
   a plurality of exponential multipliers connected respectively to a plurality of the gm amplifiers;
   a control section to vary multiplication coefficient of a plurality of the exponential multipliers according to external control signal; and
   an I-V converter circuit to aggregate current output from a plurality of the exponential multipliers and convert the aggregated current output to voltage.

2. The variable gain amplifier according to claim 1, wherein the ratio of the mutual conductance of a plurality of the gm amplifiers is 1 or more and (2n−1) or less, assuming the number of a plurality of the gm amplifiers is n.

3. The variable gain amplifier according to claim 1, wherein the output signal of the control section is generated by comparison of external control signals and a plurality of reference potentials.

4. The variable gain amplifier according to claim 3, wherein a plurality of the reference potentials are generated by the use of current sources and a plurality of series resistors.

5. The variable gain amplifier according to claim 4, wherein weighting of resistance is given to a plurality of the series resistors so that the relations of the amplification ratio of the variable gain amplifier and the external control signal may form logarithmic linearity.

6. The variable gain amplifier according to claim 1, wherein the I-V converter circuit is configured with both conversion resistors and active load for current source for level adjustment included.

7. The variable gain amplifier according to claim 6, wherein the conversion resistors fold back at a ground.

* * * * *